United States Patent
Choi et al.

(10) Patent No.: US 8,130,588 B2
(45) Date of Patent: Mar. 6, 2012

(54) SEMICONDUCTOR MEMORY DEVICE HAVING POWER SAVING MODE

(75) Inventors: JaeSeung Choi, Suwon-si (KR); Hyunsu Choi, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 173 days.

(21) Appl. No.: 12/702,631

(22) Filed: Feb. 9, 2010

(65) Prior Publication Data

US 2010/0238755 A1 Sep. 23, 2010

(30) Foreign Application Priority Data

Mar. 20, 2009 (KR) .............................. 20090023993

(51) Int. Cl.
*G11C 8/00* (2006.01)
(52) U.S. Cl. ........... 365/230.06; 365/233.5; 365/233.12; 365/229
(58) Field of Classification Search ............. 365/230.06, 365/233.5, 233.12, 229
See application file for complete search history.

(56) References Cited

U.S. PATENT DOCUMENTS

| | | | | |
|---|---|---|---|---|
| 5,898,331 A | * | 4/1999 | Fujita | ........................ 365/189.08 |
| 5,930,177 A | | 7/1999 | Kim | |
| 6,922,371 B2 | | 7/2005 | Takahashi et al. | |
| 7,145,830 B2 | | 12/2006 | Takahashi et al. | |
| 2003/0002316 A1 | * | 1/2003 | Morita et al. | ................... 365/63 |
| 2005/0169061 A1 | * | 8/2005 | Sohn et al. | ................ 365/189.03 |

FOREIGN PATENT DOCUMENTS

| | | |
|---|---|---|
| JP | 2000048572 | 2/2000 |
| JP | 2002367369 | 12/2002 |
| KR | 100225954 B1 | 7/1999 |
| KR | 1020040006677 A | 1/2004 |

* cited by examiner

Primary Examiner — Tuan T. Nguyen
(74) Attorney, Agent, or Firm — Volentine & Whitt, PLLC

(57) ABSTRACT

A semiconductor memory device includes a memory cell array arranged in rows and columns, a row decoder and a control circuit. The row decoder drives word lines connected to the memory cell array by decoding a received row address and being synchronized with an internal clock signal. The control circuit receives a clock signal, a chip select signal and a mode signal, and generates the internal clock signal. The control circuit generates the internal clock signal so that the row decoder does not operate for a predetermined time in response to the chip select signal when the mode signal transitions from a power saving mode to a normal mode.

10 Claims, 7 Drawing Sheets

| Mode Signal | Normal Mode | Normal Mode | Sleep Mode | Wake_up Mode | Normal Mode |
|---|---|---|---|---|---|
| SLN | H | H | L | H | H |
| CSN | L | H | X | H | L |
| SLD | H | H | L | L | H |

Fig. 7

SEMICONDUCTOR MEMORY DEVICE HAVING POWER SAVING MODE

CROSS-REFERENCE TO RELATED APPLICATIONS

A claim of priority is made under 35 U.S.C. §119 to Korean Patent Application No. 10-2009-0023993, filed on Mar. 20, 2009, in the Korean Intellectual Property Office, the subject matter of which is hereby incorporated by reference.

BACKGROUND

The present disclosure herein relates to a semiconductor memory device having a power saving mode.

Semiconductor devices include memory cell arrays and peripheral circuits for driving the memory cell arrays. Semiconductor memory devices may include a power saving mode to reduce power consumption. For example, semiconductor memory devices having a power saving mode are designed to minimize leakage current by cutting off power supply to the peripheral circuits driving the memory cell arrays in the power saving mode. An example of a power saving mode is a sleep mode.

Various types of portable electronic devices are widely used. Reducing or minimizing power consumption, together with high integration and miniaturization, would be useful for semiconductor memory devices in portable electronic devices, particularly those driven by batteries.

SUMMARY

According to embodiments of the inventive concept, a semiconductor memory device is provided, which includes a memory cell array arranged in rows and columns, a row decoder and a control circuit. The row decoder drives word lines connected to the memory cell array by decoding a received row address and being synchronized with an internal clock signal. The control circuit receives a clock signal, a chip select signal and a mode signal, and generates the internal clock signal. The control circuit generates the internal clock signal so that the row decoder does not operate for a predetermined time in response to the chip select signal when the mode signal transitions from a power saving mode to a normal mode. The semiconductor memory device may have stable performance in a power saving mode.

BRIEF DESCRIPTION OF THE DRAWINGS

The accompanying drawings are included to provide further understanding of the inventive concept, and are incorporated in and constitute a part of this specification. Exemplary embodiments of the inventive concept will be described with reference to the attached drawings.

DETAILED DESCRIPTION OF THE EMBODIMENTS

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

Figure 1:
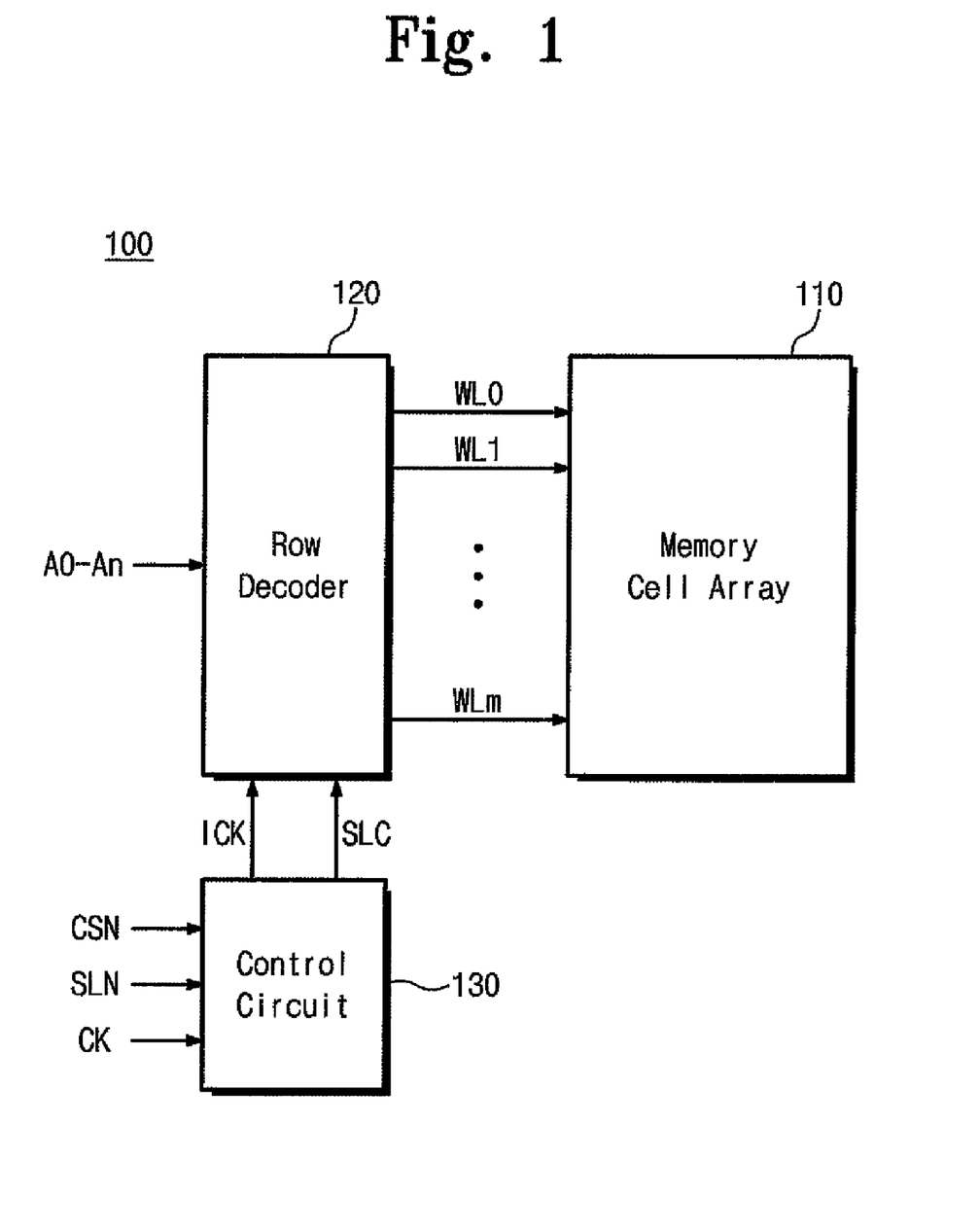
FIG. 1 is a block diagram illustrating a semiconductor memory device, in accordance with an embodiment of the inventive concept.

FIG. 1 is a block diagram illustrating a semiconductor memory device, in accordance with an illustrative embodiment of the inventive concept.

Referring to FIG. 1, semiconductor memory device 100 includes a memory cell array 110, a row decoder 120 and a control circuit 130. The memory cell array 110 includes multiple memory cells arranged by rows and columns. The rows and columns correspond to word lines (WL0-WLm) for selecting memory cells and activating the selected memory cells, and bit lines (not illustrated) for inputting and outputting data of the memory cells of the memory cell array 110.

The row decoder 120 decodes address signals (A0-An) received from the outside to select one of the word lines (WL0-WLm) of the memory cell array 110. A word line voltage required for each operation is applied to the selected word line. For example, when a read operation is performed, a read voltage is applied to the selected word line and a pass voltage is applied to unselected word lines. Voltages applied to the word lines may be applied by a voltage generator (not illustrated), for example. The control circuit 130 receives a chip select signal (CSN), a mode signal (SLN) and a clock signal (CK), and outputs an internal clock signal (ICK) and, in various embodiments, an internal mode signal (SLC) to control the row decoder 120.

Although FIG. 1 only illustrates circuits related to a power saving mode of the semiconductor memory device 100, it is understood that the semiconductor memory device 100 may further include additional circuits for reading operations, writing operations and erasing operations. Also, the semiconductor memory may be one of read only memory (ROM), a programmable ROM (PROM), a electrically alterable ROM (EAROM), erasable programmable ROM (EPROM), electrically erasable programmable ROM (EEPROM), a flash memory, a random access memory (RAM), static RAM (SRAM), phase-change RAM (PRAM), magnetic RAM (MRAM), resistive RAM (RRAM) and non-volatile RAM (NRAM), for example.

During a normal mode, the cell array 110, the row decoder 120 and the control circuit 130 can perform a reading operation, a writing operation and an erasing operation on the memory cell array 110 in response to an externally provided address and a command signal. During a power saving mode, such as a sleep mode, internal power being applied to peripheral circuits, e.g., the row decoder 120, other than the memory cell array 110, is cutoff or reduced to reduce electric power consumed by the semiconductor memory device 100.

Figure 2:
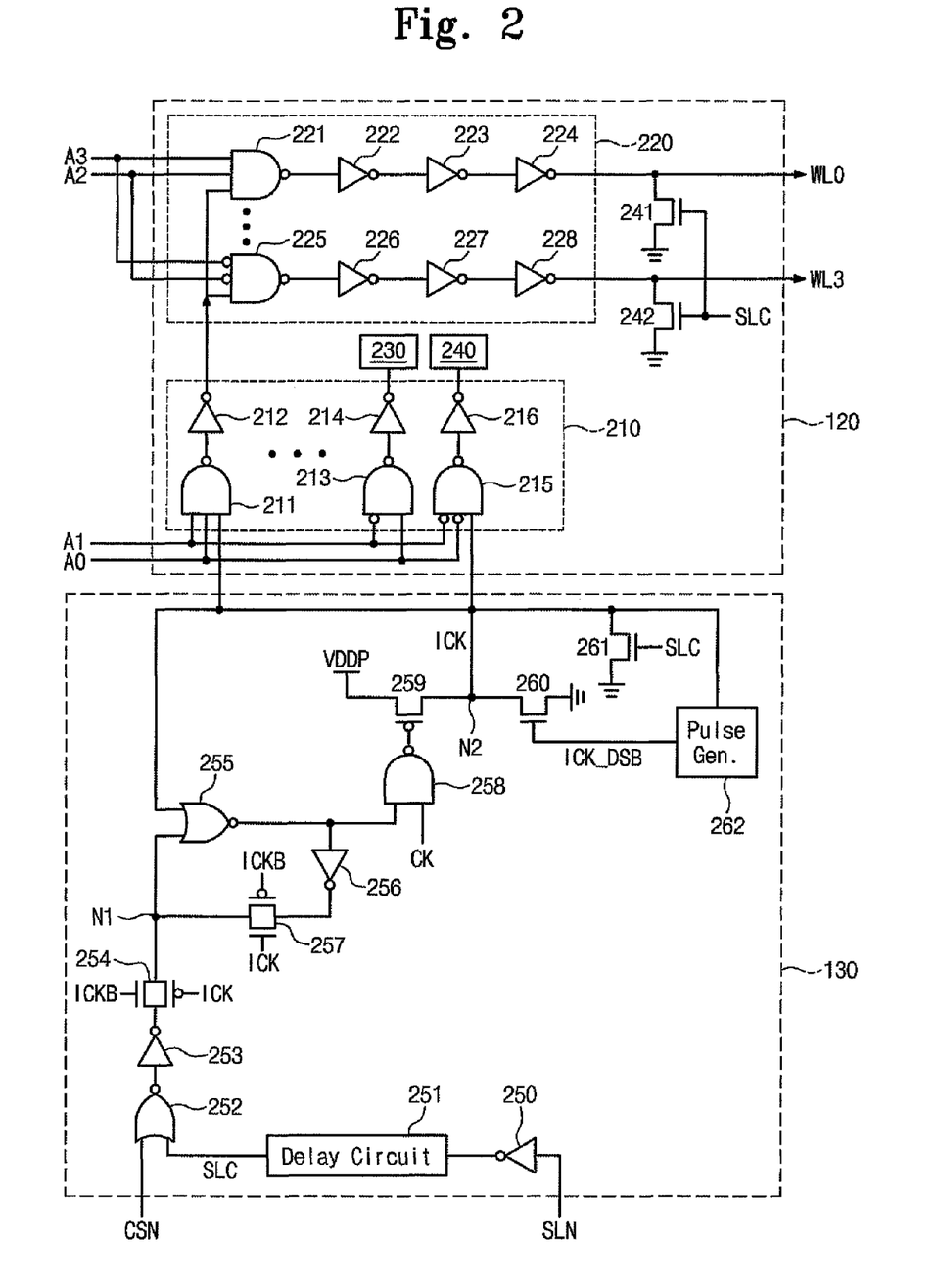
FIG. 2 is a circuit diagram illustrating a row decoder and a control circuit illustrated in FIG. 1, in accordance with an embodiment of the inventive concept.

FIG. 2 is a circuit diagram illustrating a row decoder and a control circuit of FIG. 1, in accordance with an illustrative embodiment of the inventive concept.

Referring to FIG. 2, the row decoder 120 includes a first decoder 210, second decoders 220 through 240 and NMOS transistors 241 and 242. The first decoder 210 includes NAND gates 211, 213 and 215 and inverters 212, 214 and 216. The NAND gates 211, 213 and 215 receive portions (A0, A1) of the input addresses (A0-An) and an internal clock signal (ICK) from the control circuit 130. The inverters 212, 214 and 216 are connected to outputs of the NAND gates 211, 213 and 215, respectively.

The second decoder 220 includes NAND gates 221 and 225 and inverters 222-224 and 226-228. The NAND gates 221 and 225 receive portions (A2, A3) of the input addresses (A0-An) and an output of the inverter 212 of the first decoder 210. The inverters 222-224 are serially and sequentially connected to an output of the NAND gate 221. A signal output from the inverter 224 is used to drive the word line (WL0). The inverters 226-228 are serially and sequentially connected to an output of the NAND gate 225. A signal output from the inverter 225 is used to drive the word line (WL3).

The MOS transistor 241 is connected between the word line (WL0) and a ground voltage, and has a gate connected to an internal mode signal (SLC). The MOS transistor 242 is connected between the word line (WL3) and a ground voltage, and has a gate connected to the internal mode signal (SLC). The NMOS transistors 241 and 242 are turned on to discharge the word lines (WL0, WL3) when the internal mode signal (SLC) is at a high level, representing a sleep mode (or other power saving mode).

The second decoders 230 and 240 have substantially the same construction as the second decoder 220, described above. The second decoders 230 and 240 output signals to drive the other word lines (WL4-WLm) in response to portions of the input addresses (A0-An) and the inverters 214 and 216 corresponding to the addresses, respectively.

The control circuit 130 includes inverters 250, 253 and 256, a delay circuit 251, NOR gates 252 and 255, transmission gates 254 and 257, a NAND gate 258, a PMOS transistor 259, NMOS transistors 260 and 261 and a pulse generator 262.

The inverter 250 receives an external mode signal (SLN). The delay circuit 251 delays an output of the inverter 250 for a predetermined time to output the internal mode signal (SLC). The NOR gate 252 receives the chip select signal (CSN) and the internal mode signal (SLC). The inverter 253 inverts an output of the NOR gate 252 to output the inverted output of the NOR gate 252. The transmission gate 254 responds to the internal clock signal (ICK) and an inverted internal clock signal (ICKB) to transmit the output of the inverter 253 to a node (N1). The NOR gate 255 receives the internal clock signal (ICK) and the signal at node (N1). The inverter 256 receives an output of the NOR gate 255. The transmission gate 257 transmits an output of the inverter 256 to node (N1) in response to the internal clock signal (ICK) and the inverted internal clock signal (ICKB).

The NAND gate 258 receives the output of the NOR gate 255 and the clock signal (CK). The PMOS transistor 259 is connected between a supply voltage (VDDP), which may be an internal supply voltage, and a node (N2), and has a gate controlled by an output of the NAND gate 258. The NMOS transistor 260 is connected between node (N2) and a ground voltage, and has a gate controlled by a disable signal (ICK_DSB). The signal at node (N2) is the internal clock signal (ICK), which is provided to the row decoder 120. The NMOS transistor 261 is connected between node (N2) and the ground voltage, and has a gate controlled by the internal mode signal (SLC). The pulse generator 262 receives the internal clock signal (ICK) and outputs the disable signal (ICK_DSB).

An illustrative operation of the control circuit 130 is described with reference to the timing diagram illustrated in FIG. 3.

Figure 3:
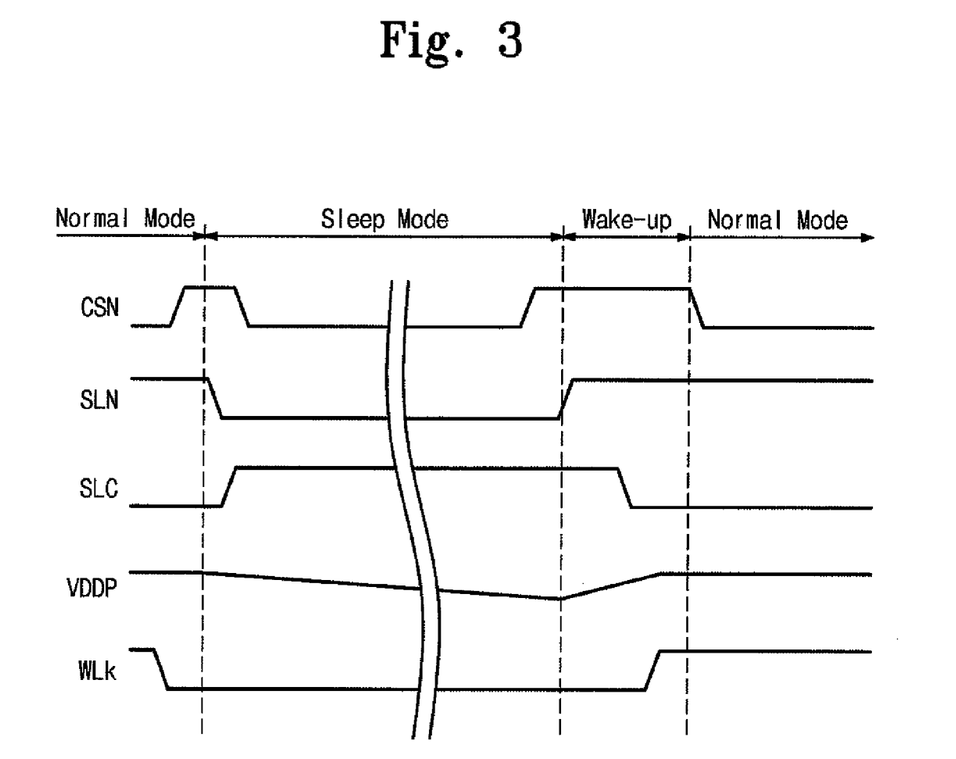
FIG. 3 is a timing diagram of signals used in the control circuit illustrated in FIG. 2, in accordance with an embodiment of the inventive concept.

Referring to FIG. 3, the mode signal (SLN) represents different modes, including a normal mode and a power saving mode, such as a sleep mode, for example. In the depicted example, when the mode signal (SLN) has a low level, the semiconductor memory device 100 operates in the sleep mode and when the mode signal (SLN) has a high level, the semiconductor memory device 100 operates in the normal mode. The chip select signal (CSN) enables an operation of the semiconductor memory device 100. The chip select signal (CSN) has a low level when the semiconductor memory device 100 is in the normal mode and the sleep mode, and has a high level when the semiconductor memory device 100 transitions from the normal mode to the sleep mode and transitions from the sleep mode to the normal mode. The internal mode signal (SLC) is formed by inverting and delaying the mode signal (SLN) for a predetermined time, using the inverter 250 and the delay circuit 251, respectively. The delay circuit 251 delays the inverted mode signal (SLN) so that the internal mode signal (SLC) transitions from a high level to a low level after a predetermined time elapses after the mode signal (SLN) transitions from a low level to a high level.

When an operation is changed from the normal mode to the sleep mode, the internal mode signal (SLC) has a low level and the chip select signal (CSN) has a high level. Thus, the inverter 253 outputs a signal having a high level. A signal at node (N1) becomes a high level signal in response to the internal clock signal (ICK) having a high level. The NOR gate 255 outputs a signal having a low level in response to the signal of node (N1) having a high level. When an output signal of the NOR gate 255 has a low level, the PMOS transistor 259 is turned off. The NMOS transistor 260 is turned on and the internal clock signal (ICK) becomes a low level signal in response to the disable signal (ICK_DSB).

The internal mode signal (SLC) has a high level during the sleep mode. When the internal mode signal (SLC) has a high level, the NMOS transistor 261 is turned on to maintain the internal clock mode (ICK) at a low level. As the internal clock signal (ICK) transitions to a low level, the transmission gate 254 is turned on and the transmission gate 257 is turned off. Since the internal mode signal (SLC) has a high level, a high level signal is transmitted to node (N1). The NOR gate 255 receives the high level signal at node (N1) and outputs a low level signal. Thus, since the NAND gate 258 outputs a high level signal regardless of the clock signal (CK), the PMOS transistor 259 is turned off. While the internal mode signal (SLC) is at a high level (e.g., the sleep mode), since the PMOS transistor 259 is kept in a turned-off state and the NMOS transistor 261 is kept in a turned-on state, the internal clock signal (ICK) is kept a low level.

In response to the internal clock signal (ICK) having a low level, the NAND gates 211-215 of the row decoder 120 output signals having high levels, and the inverters 212-216 of the row decoder 120 output signals having low levels. Thus, the NAND gates 221 and 225 output a high level signal regardless of the addresses (A3, A2) and the word lines (WL0-WL3) are driven by low level signals.

When the semiconductor memory device 100 transitions from the sleep mode to the normal mode (e.g., during wake-up), the mode signal (SLN) transitions from a low level to a high level. The delay circuit 251 delays the mode signal (SLN) for a predetermined time to output the internal mode signal (SLC) at a low level. When the internal mode signal (SLC) transitions to a low level, the transistors 241, 242 and 261 are turned off. The supply voltage (VDDP) begins to rise substantially simultaneously with the transition of the mode signal (SLN) to a high level. If the internal mode signal (SLC) were to transition to a low level before the supply voltage (VDDP) increases to a high enough level, the word lines (WL0-WLm) may be driven to an unwanted signal level, e.g., due to unstable states of the circuits in the row decoder 120, which may deteriorate reliability of the semiconductor memory device 100. Therefore, stable operation must be attained when the operation mode of the semiconductor memory device 100 changes from the sleep mode to the normal mode, as discussed below.

The delay circuit 251 may include multiple inverters (not shown), serially connected to one another. The number of inverters is determined by the delay of the mode signal (SLN) needed for the supply voltage (VDDP) to increase to a sufficiently high level, which may require several inverters. Accordingly, the delay circuit 251 may increase the circuit area of the semiconductor memory device 100. Also, if channel widths and channel lengths of transistors constituting the inverters are changed according to a semiconductor process, when the semiconductor memory device 100 is awakened from the sleep mode to the normal mode, the point of time at which the internal mode signal (SLC) transitions from a high level to a low level may differ according to the semiconductor device. This may also cause the reliability of the semiconductor memory device 100 to deteriorate.

Figure 4:
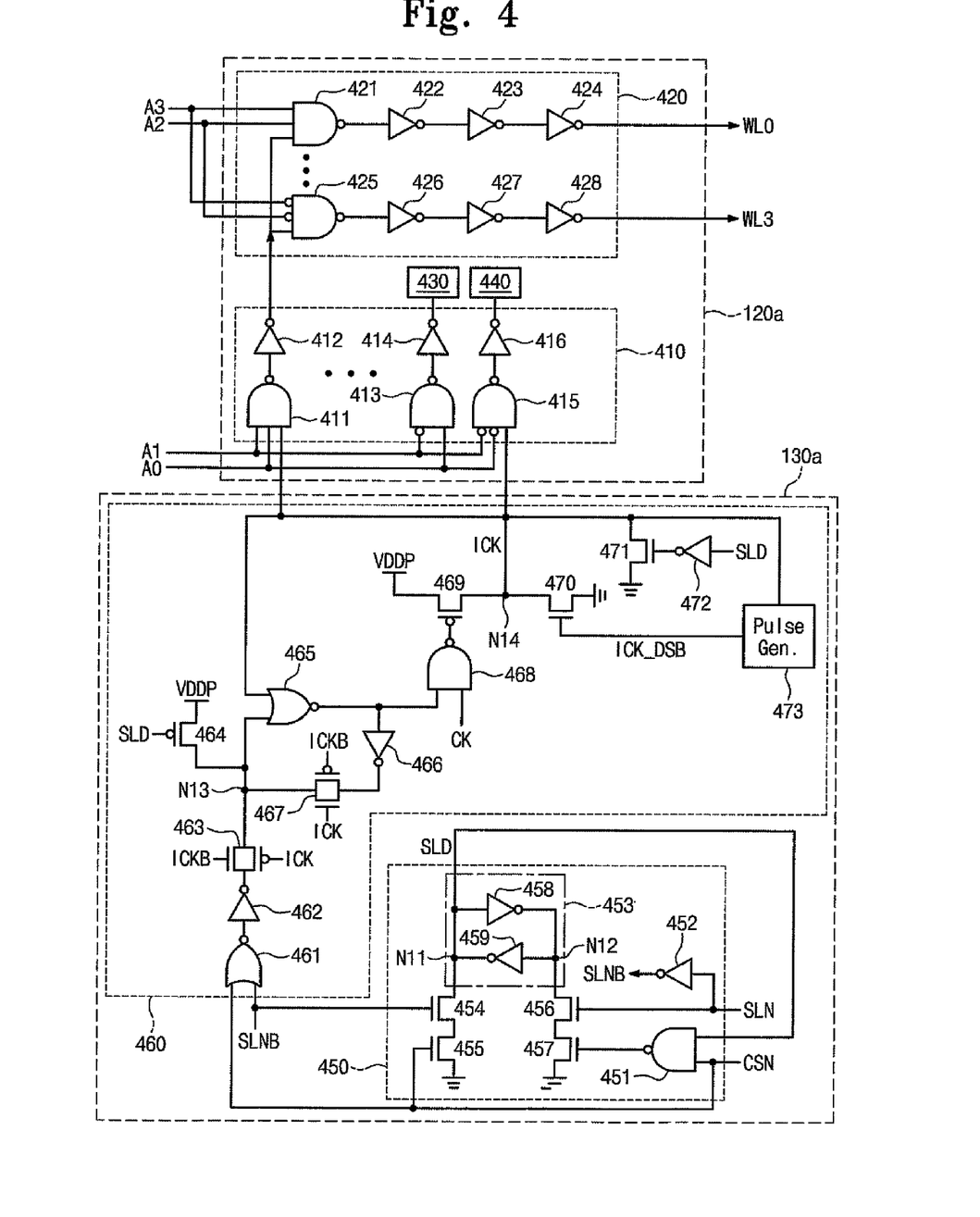
FIG. 4 is a circuit diagram illustrating a row decoder and a control circuit illustrated in FIG. 1, in accordance with another embodiment of the inventive concept.

FIG. 4 is a circuit diagram illustrating a row decoder and a control circuit of FIG. 1, in accordance with another illustrative embodiment of the inventive concept.

Referring to FIG. 4, a row decoder 120a includes a first decoder 410 and second decoders 420-440. The first decoder 410 includes NAND gates 411, 413 and 415, and inverters 412, 414 and 416. The NAND gates 411, 413 and 415 receive portions (A0, A1) of addresses (A0-An), and receive internal clock signal (ICK) from a control circuit 130a. The inverters 412, 414 and 416 are connected to outputs of the NAND gates 411, 413 and 415 respectively.

The second decoder 420 includes NAND gates 421 and 425 and inverters 422-424 and 426-428. The NAND gates 421 and 425 receive portions (A2, A3) of addresses (A0-An) and an output of the inverter 412 of the first decoder 410. The inverters 422-424 are serially and sequentially connected to an output of the NAND gate 421. A signal output from the inverter 424 is used to drive the word line (WL0). The inverters 426-428 are serially and sequentially connected to an output of the NAND gate 425. A signal output from the inverter 425 is used to drive the word line (WL3).

As discussed above, the row decoder 120 in the embodiment illustrated in FIG. 2 includes the NMOS transistors 241 and 242. In comparison, the decoder 120a in the embodiment illustrated in FIG. 4 does not such include NMOS transistors. In addition, unlike the row decoder 120 shown in FIG. 2, the row decoder 120a need not receive an internal mode signal (SLC).

The second decoders 430 and 440 have substantially the same configuration as the second decoder 420. The second decoders 430 and 440 output signals to drive the other word lines (WL4-WLm) in response to portions of the input addresses (A0-An) and the inverters 414 and 416 corresponding to the addresses, respectively.

The control circuit 130a includes control logic circuit 450 and an internal clock generator 460. The control logic circuit 450 receives the chip select signal (CSN) and the mode signal (SLN) and outputs an internal mode signal (SLD). The internal clock generator 460 receives the internal mode signal (SLD), the chip select signal (CSN), an inverted mode signal (SLNB) and a clock signal (CK) to generate the internal clock signal (ICK). The internal clock generator 460 includes inverters 462, 466 and 472, NOR gates 461 and 465, transmission gates 463 and 467, a NAND gate 468, PMOS transistors 464 and 469, NMOS transistors 470 and 471, and a pulse generator 473.

The control logic circuit 450 includes a NAND gate 451, an inverter 452, a latch 453 and NMOS transistors 454-457. The NAND gate 451 receives the chip signal (CSN) and the internal mode signal (SLD), which is a feedback signal. The inverter 452 receives the mode signal (SLN) and outputs an inverted mode signal (SLNB). The latch 453 includes inverters 458 and 459. An input and an output of the inverter 458 are connected to nodes (N11, N12) respectively, and an input and an output of the inverter 459 are connected to nodes (N12, N11) respectively. The NMOS transistors 454 and 455 are serially and sequentially connected between node (N11) and a ground voltage. A gate of the NMOS transistor 454 is connected to the inverted mode signal (SLNB) and a gate of the NMOS transistor 455 is connected to the chip select signal (CSN). The NMOS transistors 456 and 457 are serially and sequentially connected between node (N12) and a ground voltage. A gate of the NMOS transistor 456 is connected to the mode signal (SLN) and a gate of the NMOS transistor 457 is connected to an output of the NAND gate 451.

The NOR gate 461 of the internal clock generator 460 receives the chip select signal (CSN) and the inverted mode signal (SLNB). The inverter 462 inverts an output of the NOR gate 461. The transmission gate 463 transmits an output of the inverter 462 to a node (N13) in response to the inverted internal clock signal (ICKB) and the internal clock signal (ICK). The NOR gate 465 receives the internal clock signal (ICK) and the signal at node (N13). The inverter 466 receives an output of the NOR gate 465. The transmission gate 467 transmits an output of the inverter 466 to node (N13) in response to the internal clock signal (ICK) and the inverted internal clock signal (ICKB).

The NAND gate 468 receives an output of the NOR gate 465 and the clock signal (CK). The PMOS transistor 469 is connected between the supply voltage (VDDP), which may be an internal supply voltage, and a node (N14), and has a gate controlled by an output of the NAND gate 468. The MOS transistor 470 is connected between node (N14) and the ground voltage, and has a gate controlled by disable signal (ICK_DSB). A signal at node (N14) is the internal clock signal (ICK), which is provided to the row decoder 120a. The inverter 472 inverts the internal mode signal (SLD). The MOS transistor 471 is connected between node (N14) and the ground voltage, and has a gate controlled by an output of the inverter 472. The pulse generator 473 receives the internal clock signal (ICK) and outputs the disable signal (ICK_DSB).

The pulse generator 473 outputs the disable signal (ICK_DSB) to control pulse width. For example, if the PMOS transistor 469 is turned on in response to the clock signal (CK) while the signal output from the NOR gate 465 has a high level, the internal clock signal (ICK) becomes a high level signal. The pulse generator 473 activates the disable signal (ICK_DSB) at a high level in response to the internal clock signal (ICK) being at a high level. If the NMOS transistor 470 is turned on in response to the disable signal (ICK_DSB) having a high level, the internal clock signal (ICK) transitions to a low level. The pulse width of the internal clock signal (ICK) thus may be controlled by controlling the point of time at which the pulse generator 473 activates the disable signal (ICK_DSB) to a high level in response to the internal clock signal (ICK).

An illustrative operation of the control circuit 130*a* is described with reference to the timing diagram illustrated in FIG. 5 and the table illustrated in FIG. 6.

Figure 5:
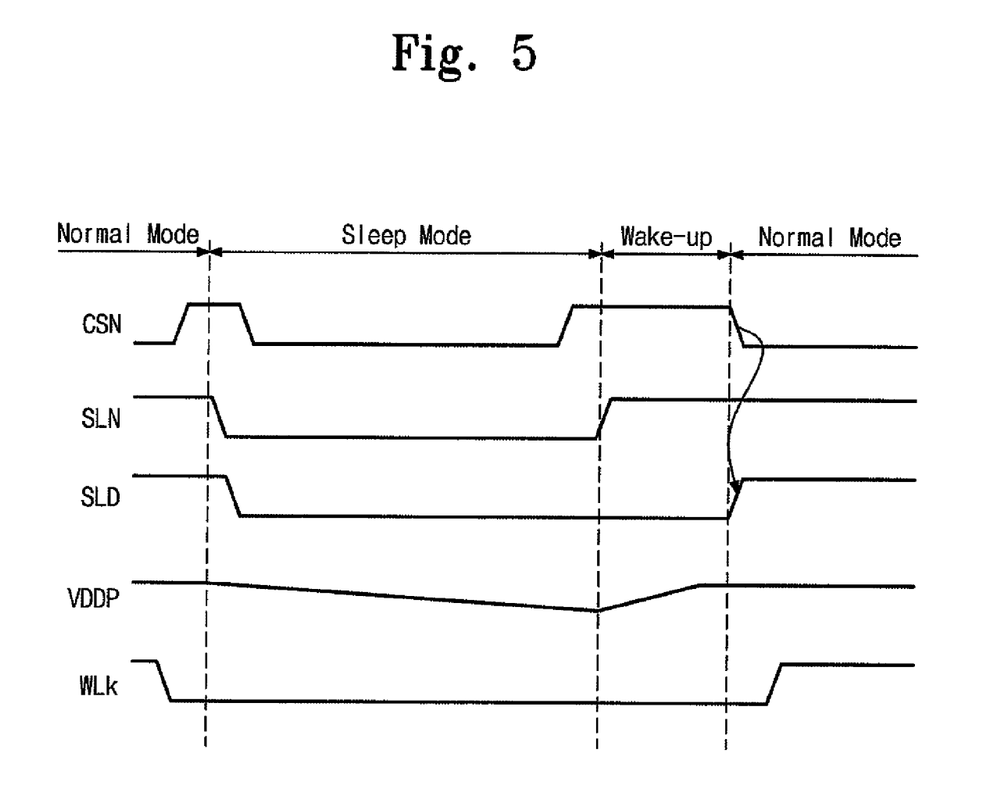
FIG. 5 is a timing diagram of signals used in the control circuit illustrated in FIG. 4, in accordance with an embodiment of the inventive concept.
Figure 6:
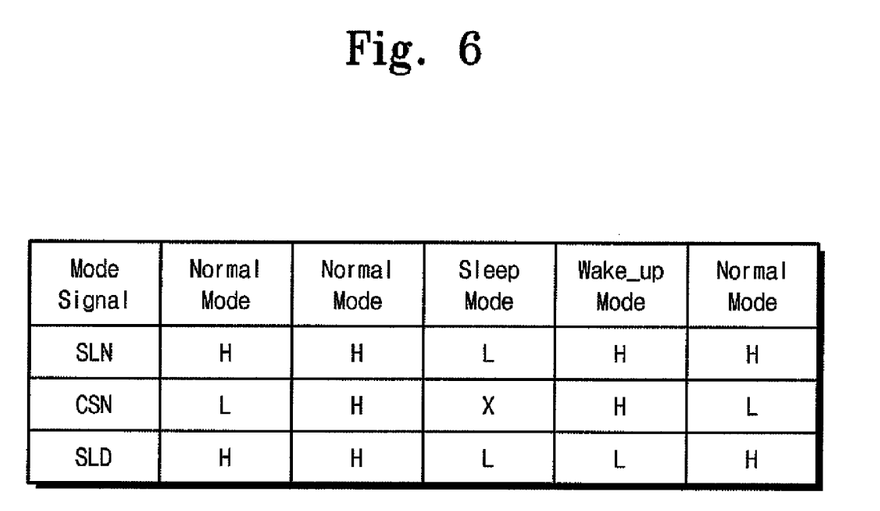
FIG. 6 is a table illustrating signal levels of signals used in the control circuit illustrated in FIG. 4, in accordance with an embodiment of the inventive concept.

FIG. 5 is a timing diagram of signals used in the control circuit illustrated in FIG. 4, in accordance with an embodiment of the inventive concept. FIG. 6 is a table illustrating signal levels of signals used in the control circuit illustrated in FIG. 4, in accordance with an embodiment of the inventive concept.

As described above, the mode signal (SLN) is a signal representing a normal mode and a power saving mode, such as a sleep mode, for example.

When the mode signal (SLN) has a low level, the semiconductor memory device 100 operates in the sleep mode, and when the mode signal (SLN) has a high level, the semiconductor memory device 100 operates in the normal mode. The chip select signal (CSN) enables an operation of the semiconductor memory device 100. The chip select signal (CSN) has a low level when the semiconductor memory device 100 is in the normal mode and the sleep mode, and has a high level when the semiconductor memory device 100 transitions from the normal mode to the sleep mode and transitions from the sleep mode to the normal mode.

First, an operation of the normal mode is described, where the mode signal (SLN) has a high level. When the mode signal (SLN) and the internal mode signal (SLD) have high levels and the chip select signal (CSN) has a low level, the NMOS transistors 456 and 457 are turned on and the NMOS transistors 454 and 455 are turned off. Thus, the internal mode signal (SLD) is kept a high level. Since the internal mode signal (SLD) has a high level, the NMOS transistor 471 is turned off and the PMOS transistor 464 is also turned off. At this time, the row decoder 120*a* is synchronized with the internal clock signal (ICK) corresponding to the clock signal (CK) and responds to the addresses (A0-An) to drive the word lines (WL0-WLm).

When the internal clock signal (ICK) has a high level, the NOR gate 465 outputs a low level signal, the NAND gate 468 outputs a high level signal and the PMOS transistor 469 is turned off. The pulse generator 473 outputs the disable signal (ICK_DSB) in response to the internal clock signal (ICK) having a high level to turn on the NMOS transistor 470. Since the PMOS transistor 469 is turned off and the NMOS transistor 470 is turned on, the internal clock signal (ICK) becomes a low level signal. The disable signal (ICK_DSB) transitions to a low level, so that the internal clock signal (ICK) transitions to a high level in the next cycle of the clock signal (CK).

When the internal clock signal (ICK) has a low level, the transmission gate 463 is turned on. Since the inverted mode signal (SLNB) has a low level and the chip select signal (CSN) has a low level, a low level signal is transmitted to node (N13). The NOR gate 465 outputs a high level signal in response to the internal clock signal (ICK) having a low level and a signal at node (N13) having a low level. The NAND gate 468 turns on the PMOS transistor 469 in response to the clock signal (CK). Since the PMOS transistor 469 is turned on, the internal clock signal (ICK) becomes a high level signal. In this manner, the control circuit 130*a* outputs the internal clock signal (ICK) synchronized with the clock signal (CK) during the normal mode.

Even if the chip select signal (CSN) transitions from a low level to a high level in the normal mode, since the internal mode signal (SLD) has a high level, the internal mode signal (SLD) output from the control logic circuit 450 is kept at a high level.

After the chip select signal (CSN) transitions to a high level, when the internal clock signal (ICK) has a low level, the signal at node (N13) becomes a high level signal and the output of the NOR gate 465 becomes a low level signal. Thus, the output of the NAND gate 468 becomes a high level signal and the PMOS transistor 469 is turned off. The internal clock signal (ICK) is kept at a low level and the row decoder 120*a* begins to drive the word lines (WL0-WLm) at a low level.

The mode signal (SLN) has a low level during the sleep mode. The NMOS transistor 471 is turned on in response to the mode signal (SLN) of a low level, so the internal clock signal (ICK) becomes a low level. The row decoder 120*a* responds to the internal clock signal (ICK) having a low level to drive the word lines (WL0-WLm) at a low level. When the internal mode signal (SLD) has a low level, the PMOS transistor 464 is turned on, so that the signal at node (N13) becomes a high level signal. The NOR gate 465 receiving the high level signal at node (N13) outputs a low level signal, and the NAND gate 468 outputs a high level signal. While the internal mode signal (SLD) has a low level in the sleep mode, since the PMOS transistor 469 is kept in a turned-off state and the NMOS transistor 471 is kept in a turned-on state, the internal clock signal (ICK) is kept at a low level.

A wake-up mode occurs when an operation mode is changed from the sleep mode to the normal mode. During the wake-up mode, the supply voltage (VDDP) increases to a stable level after the mode signal (SLN) transitions from a low level to a high level. When the mode signal (SLN) transitions from a low level to a high level and the chip select signal (CSN) transitions from a low level to a high level, the MOS transistor 456 is turned on, but the NMOS transistor 457 remains turned off. Thus, the internal mode signal (SLD) is kept a low level.

When the chip select signal (CSN) transitions from a high level to a low level at the end of the wake-up mode (which may be referred to as activating the chip select signal (CSN)), the NAND gate 451 outputs a high level signal, and the NMOS transistor 457 is turned on. The NMOS transistor 456 is already turned on in response to the mode signal (SLN) having a high level. Since the NMOS transistors 454 and 455 are turned off by the inverted mode signal (SLNB) and the chip select signal (CSN), the internal mode signal (SLD) transitions from a low level to a high level, as shown in FIG. 5.

As the internal mode signal (SLD) transitions to a high level, the NMOS transistor 471 and the PMOS transistor 464 are turned off, respectively. At this time, since the internal clock signal (ICK) has a low level, the transmission gate 463 is turned on. Since the chip select signal (CSN) and the inverted mode signal (SLNB) are at low levels, a low level signal is transmitted to node (N13). The NOR gate 465 receiving the internal clock signal (ICK) and the low level signal at node (N13) outputs a high level signal, and turns on the PMOS transistor 469 in response to the clock signal (CK).

As described above, when the mode signal (SLN) transitions from a low level to a high level, since the internal mode signal (SLD) is kept at a low level for a predetermined time, the internal clock signal (ICK) that is output has a low level. After the mode signal (SLN) transitions from a low level to a high level, the internal mode signal (SLD) does not transition to a high level until the chip select signal (CSN) transitions from a high level to a low level, during which time the supply voltage (VDDP) increases to a substantially normal level. That is, when the operation mode wakes up from the sleep mode to the normal mode, when the chip select signal (CSN) transitions to a low level, the control circuit 130a is synchronized with the clock signal (CK) to generate the internal clock signal (ICK). Thus, when an operation mode changes from the sleep mode to the normal mode, the chip select signal (CSN) is kept a high level until the supply voltage (VDDP) is sufficiently raised to a normal level, and thus the control circuit 130a can perform a stable wake-up.

Figure 7:
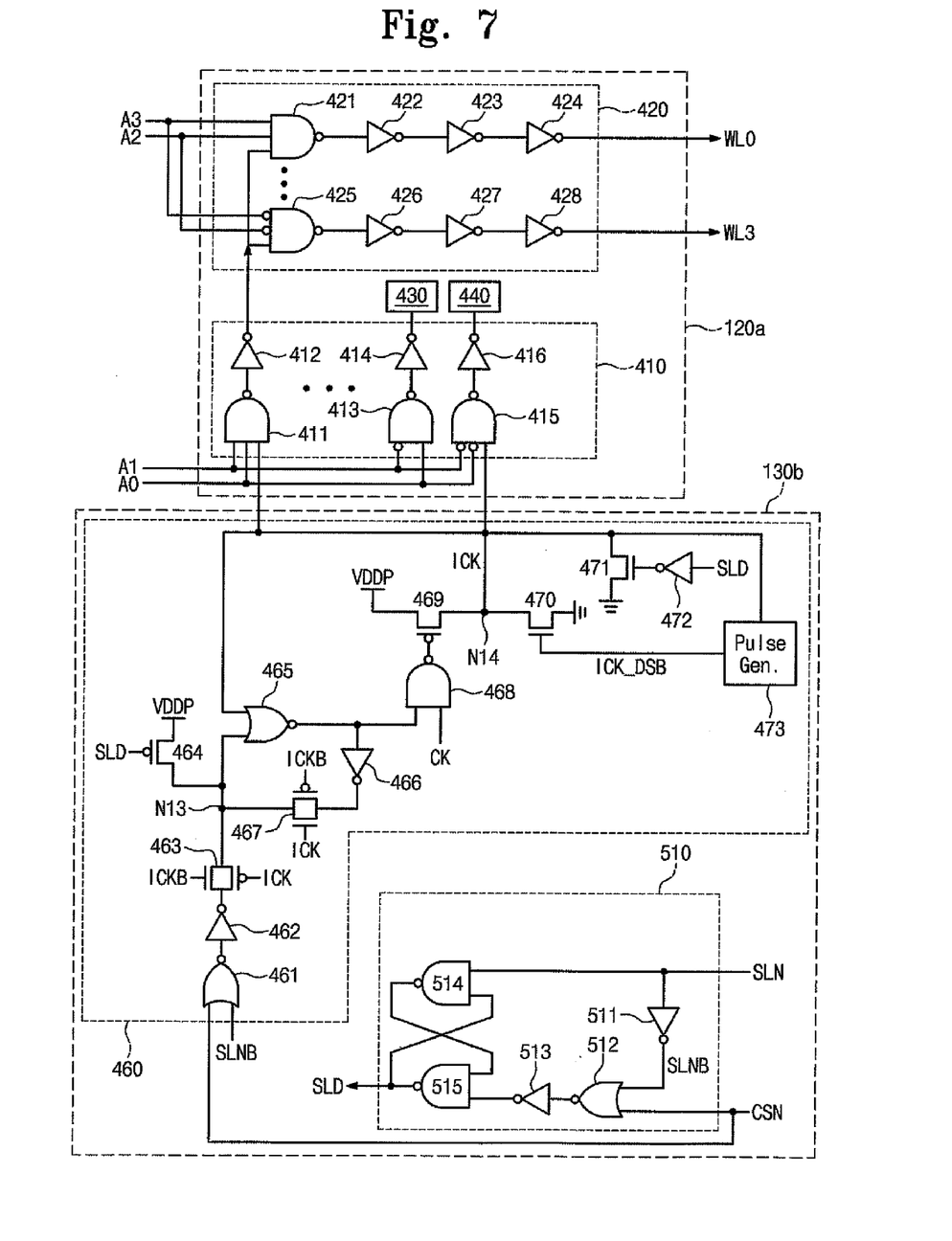
FIG. 7 is a circuit diagram illustrating the row decoder illustrated in FIG. 4 and a control circuit illustrated in FIG. 1, in accordance with another embodiment of the inventive concept.

FIG. 7 is a circuit diagram illustrating a control circuit of FIG. 1 and the row decoder of FIG. 4, in accordance with another illustrative embodiment of the inventive concept. A control circuit 130b illustrated in FIG. 7 generally has the same circuit components as the control circuit 130a illustrated in FIG. 4, except that the control circuit 130b includes a control logic circuit 510 in place of the control logic circuit 450 of the control circuit 130a.

Referring to FIG. 7, the control logic circuit 510 includes inverters 511 and 513, a NOR gate 512, and NAND gates 514 and 515. The inverter 511 receives the mode signal (SLN) and outputs the inverted mode signal (SLNB). The NOR gate 512 receives the inverted mode signal (SLNB) and the chip select signal (CSN). The inverter 513 inverts an output of the NOR gate 512. The NAND gate 514 receives the mode signal (SLN) and the internal mode signal (SLD), which is an output signal of the NAND gate 515. The NAND gate 515 receives an output of the inverter 513 and an output of the NAND gate 514.

An illustrative operation of the control logic circuit 510 having the configuration described above is as follows.

The mode signal (SLN) has a high level and the chip select signal (CSN) has a low level during the normal mode. At this time, the internal mode signal (SLD) has a high level. Although the chip select signal (CSN) is changed to a high level when an operation mode is changed from the normal mode to the sleep mode, the internal mode signal (SLD) remains at a high level.

When an operation mode completely enters the sleep mode, the mode signal (SLN) transitions to a low level. The NAND gate 514 outputs a signal having a high level in response to the mode signal (SLN) having a low level. Since the mode signal (SLN) having a low level is inverted to a high level by the inverter 511, a signal output through the NOR gate 512 and the inverter 513 has a high level. Thus, the internal mode signal (SLD) output from the NAND gate 515 transitions to a low level.

The mode signal (SLN) and the chip select signal (CSN) have high levels in a wake-up state to transition from the sleep mode to the normal mode. Although the mode signal (SLN) transitions to a high level, since the internal mode signal (SLD) has a low level, the NAND gate 514 outputs a high level signal. Also, although the inverted mode signal (SLNB) output through the inverter 511 has a low level, since the chip select signal (CSN) has a high level, the signal output through the NOR gate 512 and the inverter 513 still has a high level. Thus, the internal mode signal (SLD) output from the NAND gate 515 is kept at a low level.

When the supply voltage (VDDP) has sufficiently increased to reach a stable level, the chip select signal (CSN) transitions to a low level. Since the inverted mode signal (SLNB) has a low level and the chip select signal (CSN) has a low level, a signal output through the NOR gate 512 and the inverter 513 transitions to a low level. Thus, the internal mode signal (SLD) output from the NAND gate 515 has a high level, and a signal output from the NAND gate 514 has a low level.

The above-describe subject matter is to be considered illustrative, and not restrictive. While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A semiconductor memory device comprising:
a memory cell array comprising rows and columns;
a row decoder driving word lines connected to the memory cell array by decoding a received row address and being synchronized with an internal clock signal; and
a control circuit receiving a clock signal, a chip select signal and a mode signal and generating the internal clock signal, the control circuit generating the internal clock signal in response to the chip select signal so that the row decoder does not operate for a predetermined time when the mode signal transitions from a power saving mode to a normal mode.

2. The semiconductor memory device of claim 1, wherein the chip select signal is activated after a delay enabling a supply voltage to increase to a substantially normal level when the mode signal transitions from the sleep mode to the normal mode.

3. The semiconductor memory device of claim 2, wherein the control circuit comprises:
a control logic circuit receiving the chip select signal and the mode signal and outputting an internal mode signal; and
an internal clock generator receiving the internal mode signal, the chip select signal, the mode signal and the clock signal to generate the internal clock signal.

4. The semiconductor memory device of claim 3, wherein the control logic circuit transitions the internal mode signal to a first level when the mode signal represents the sleep mode, and transitions the internal mode signal to a second level when the chip select signal is activated after the mode signal transitions from the sleep mode to the normal mode.

5. The semiconductor memory device of claim 3, wherein the control logic circuit comprises:
a first transistor and a second transistor serially and sequentially connected between a first latch node and a ground voltage, wherein a gate of the first transistor is controlled by an inverted mode signal and a gate of the second transistor is controlled by the chip select signal;
a third transistor and a fourth transistor serially and sequentially connected between a second latch node and the ground voltage, wherein a gate of the third transistor is connected to the mode signal and a gate of the fourth transistor is connected to the chip select signal;
a first inverter connected between the first latch node and the second latch node; and
a second inverter connected between the second latch node and the first latch node,
wherein a signal at the first latch node is the internal mode signal.

6. The semiconductor memory device of claim 3, wherein the internal clock generator comprises:
a logic circuit driving a first node in response to the internal clock signal, the chip select signal and the mode signal;

a first transistor connected between the supply voltage and the first node, and controlled by the internal mode signal; and a clock controller selectively providing the clock signal as the internal clock signal in response to the internal clock signal and a signal at the first node.

7. The semiconductor memory device of claim 6, wherein the logic circuit comprises:

a first logic receiving the chip select signal and the mode signal; and a switching circuit transmitting an output of the first logic to the first node in response to the internal clock signal.

8. The semiconductor memory device of claim 6, wherein the internal clock generator further comprises:

a second transistor connected between the internal clock signal and the ground voltage and controlled by the internal mode signal.

9. The semiconductor memory device of claim 6, wherein the clock controller comprises:

a NOR gate outputting a first signal in response to the internal clock signal and a signal of the first node;

a NAND gate receiving the output of the NOR gate and the clock signal;

a third transistor connected between the supply voltage and a second node, and controlled by an output of the NAND gate;

a fourth transistor connected between the second node and a ground voltage; and a pulse generator outputting a disable signal to control a gate of the third transistor in response to the internal clock signal.

10. The semiconductor memory device of claim 3, wherein the control logic circuit comprises:

a logic circuit receiving the mode signal and the chip select signal;

a first logic gate receiving the mode signal and the internal mode signal; and a second logic gate receiving outputs of the logic circuit and the first logic gate, and outputting the internal mode signal.

* * * * *